United States Patent
Kim et al.

(10) Patent No.: US 11,749,637 B2
(45) Date of Patent: Sep. 5, 2023

(54) HYBRID BONDING INTERCONNECTION USING LASER AND THERMAL COMPRESSION

(71) Applicant: Amkor Technology Singapore Holding Pte. Ltd., Singapore (SG)

(72) Inventors: Min Ho Kim, Seoul (KR); Seok Ho Na, Incheon (KR); Dong Hyeon Park, Seoul (KR); Choong Hoe Kim, Seoul (KR); Woo Kyung Ju, Gyeonggi-do (KR); Yun Seok Song, Gwangju (KR); Dong Su Ryu, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 266 days.

(21) Appl. No.: 16/908,928

(22) Filed: Jun. 23, 2020

(65) Prior Publication Data
US 2021/0398940 A1  Dec. 23, 2021

(51) Int. Cl.
   *B23K 26/50* (2014.01)
   *H01L 23/00* (2006.01)
   *B23K 101/40* (2006.01)

(52) U.S. Cl.
   CPC .............. *H01L 24/81* (2013.01); *B23K 26/50* (2015.10); *H01L 24/75* (2013.01); *B23K 2101/40* (2018.08); *H01L 2224/75263* (2013.01); *H01L 2224/81048* (2013.01); *H01L 2224/81201* (2013.01); *H05K 2201/068* (2013.01)

(58) Field of Classification Search
   None
   See application file for complete search history.

(56) References Cited

U.S. PATENT DOCUMENTS

| | | | | |
|---|---|---|---|---|
| 4,534,811 A | * | 8/1985 | Ainslie | B23K 26/06 219/56.22 |
| 5,178,319 A | * | 1/1993 | Coucoulas | C04B 35/645 428/650 |
| 5,948,286 A | * | 9/1999 | Chalco | B23K 26/06 219/121.64 |
| 6,582,548 B1 | * | 6/2003 | Dautartas | G02B 6/3636 219/121.64 |

(Continued)

FOREIGN PATENT DOCUMENTS

KR   2014094086 A  *  7/2014  ............. H01L 24/75

OTHER PUBLICATIONS

Choi et al.—Laser-Assisted Bonding with Compression, IEEE 69th Electronic Components and Technology Conference, 2019, p. 197-203 (Year: 2019).*

*Primary Examiner* — Devang R Patel
(74) *Attorney, Agent, or Firm* — Spectrum IP Law Group LLC

(57) ABSTRACT

In one example, a method to manufacture a semiconductor device comprises providing an electronic component over a substrate, wherein an interconnect of the electronic component contacts a conductive structure of the substrate, providing the substrate over a laser assisted bonding (LAB) tool, wherein the LAB tool comprises a stage block with a window, and heating the interconnect with a laser beam through the window until the interconnect is bonded with the conductive structure. Other examples and related methods are also disclosed herein.

21 Claims, 13 Drawing Sheets

(56) References Cited

U.S. PATENT DOCUMENTS

| | | | |
|---|---|---|---|
| 7,156,285 B2* | 1/2007 | Sergey | B23K 20/008 228/262.1 |
| 2003/0217996 A1* | 11/2003 | Steur | B23K 1/0056 257/E21.511 |
| 2012/0118939 A1* | 5/2012 | Kusanagi | H01L 24/75 228/19 |
| 2017/0301560 A1* | 10/2017 | Yoon | H01L 21/4853 |
| 2018/0366433 A1* | 12/2018 | Ahn | H01L 25/50 |
| 2021/0082717 A1 | 3/2021 | Yoon et al. | |

\* cited by examiner

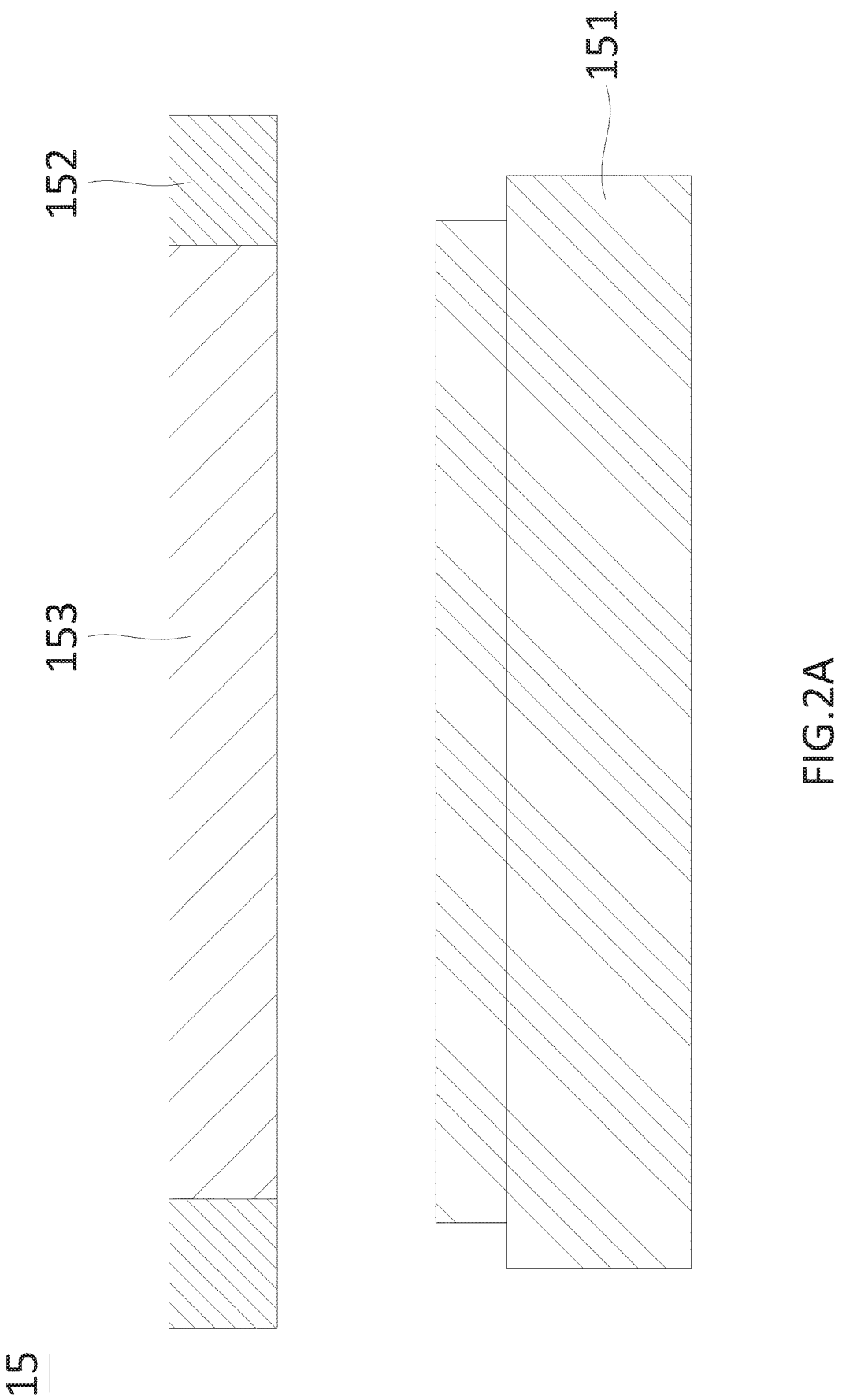

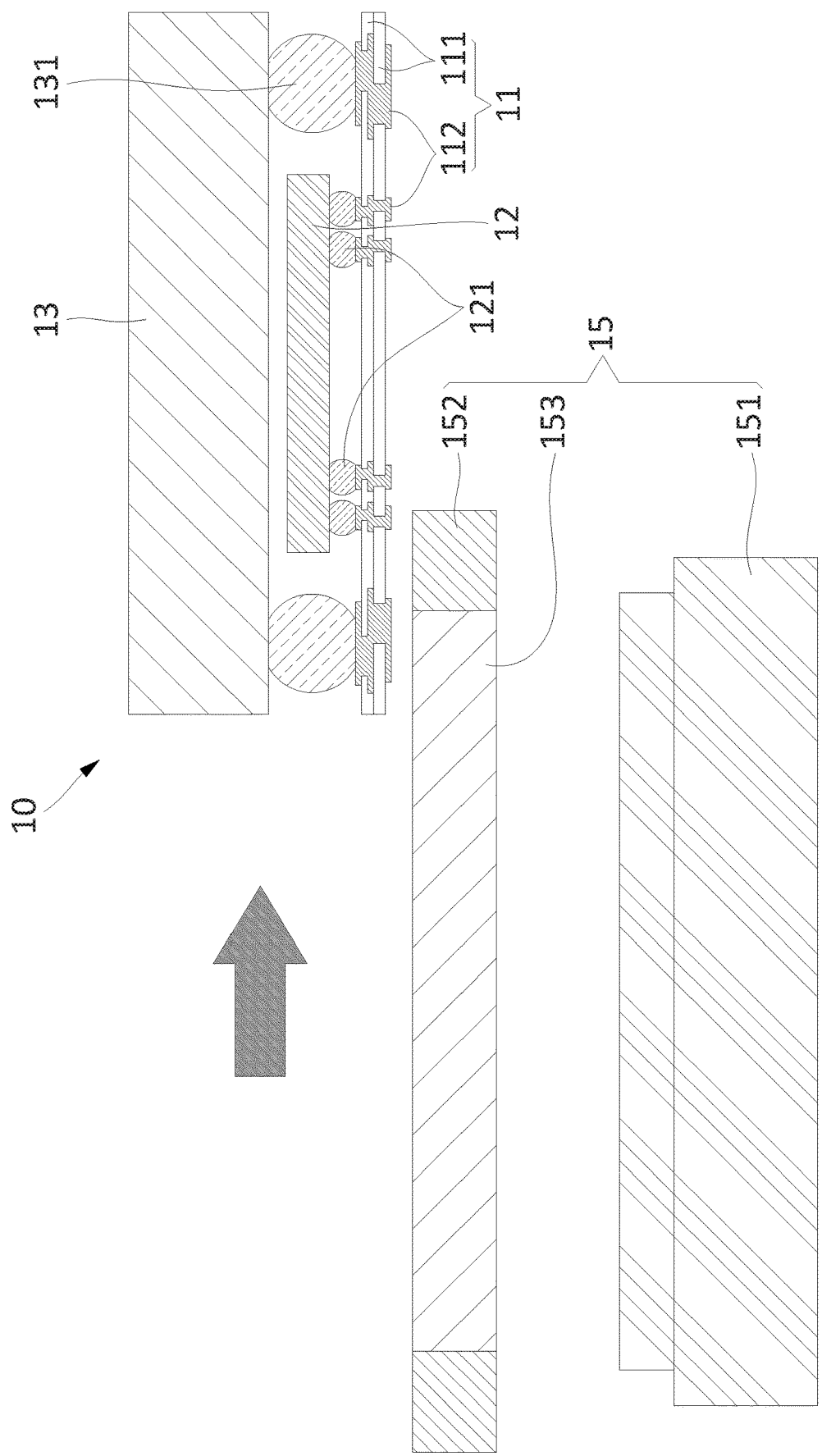

US 11,749,637 B2

HYBRID BONDING INTERCONNECTION USING LASER AND THERMAL COMPRESSION

TECHNICAL FIELD

The present disclosure relates, in general, to electronic devices, and more particularly, to bonder tool and methods for bonding semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2B show cross-sectional views of an example bonder tool for bonding an example semiconductor device.

FIGS. 3A to 3C show cross-sectional views of an example method for bonding an example semiconductor device.

Figure 1A:
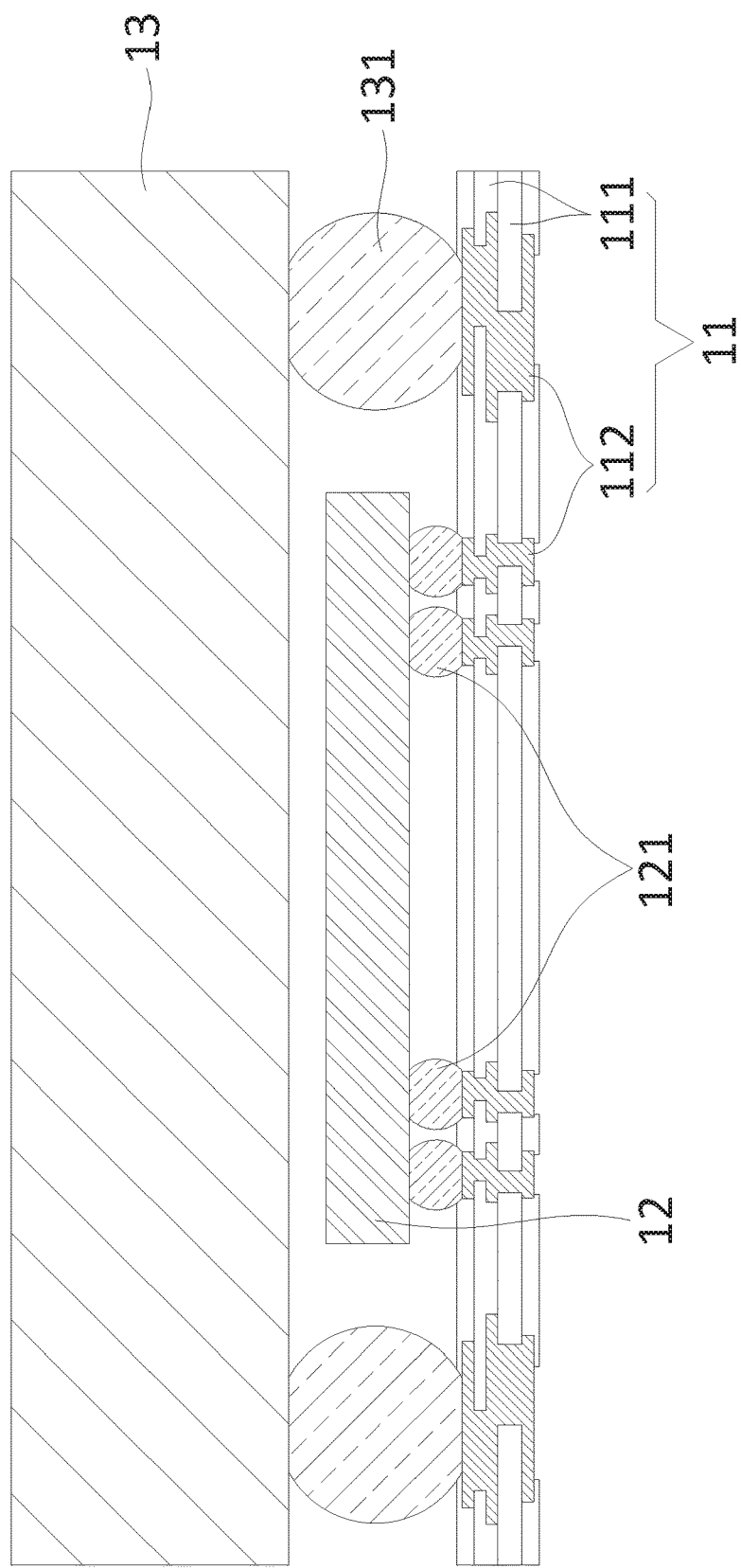
FIGS. 1A to 1C show cross-sectional views of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), z), (x, y, z)}.

The terms "comprises," "comprising," "includes," "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a method to manufacture a semiconductor device comprises providing an electronic component over a substrate, wherein an interconnect of the electronic component contacts a conductive structure of the substrate, providing the substrate over a laser assisted bonding (LAB) tool, wherein the LAB tool comprises a stage block with a window, and heating the interconnect with a laser beam through the window until the interconnect is bonded with the conductive structure.

In another example, a method to manufacture a semiconductor device comprises providing an electronic component over a first substrate side of a substrate, wherein an interconnect of the electronic component contacts a conductive structure of the substrate, providing the substrate in a hybrid bonder tool comprising a laser assisted boding (LAB) tool and a thermal/compression boding (TCB) tool, applying a first heat to the interconnect with a laser beam from the LAB tool through a second substrate side opposite the first substrate side, and applying a second heat or compression to the interconnect with the TCB tool through the electronic component.

In a further example, a system comprises a laser assisted bonding (LAB) tool comprises a laser source, a stage block with a window over the laser source, wherein the laser source is configured to emit a laser beam through the window to apply a first heat on an interconnect of a workpiece supported by the stage block.

Other examples are included in the present disclosure. Such examples may be found in the figures, in the claims, or in the description of the present disclosure.

FIG. 1A shows a cross-sectional view of an example semiconductor device 10. In the example shown in FIG. 1A, semiconductor device 10 can comprise substrate 11, electronic components 12 or 13, and interconnects 121 or 131. Substrate 11 can comprise dielectric structure 111 and conductive structure 112. Substrate 11 and interconnects 121 or 131 can provide electrical coupling between an external component and electronic components 12 or 13. In some examples, at least one of electronic component 12 or electronic component 13 can comprise mold compound or a molded package comprising mold compound. In such examples, the mold compound or molded package optionally can include one of electronic component 12 or electronic component 13 located inside, on, or under the mold compound or molded package.

Figure 1B:
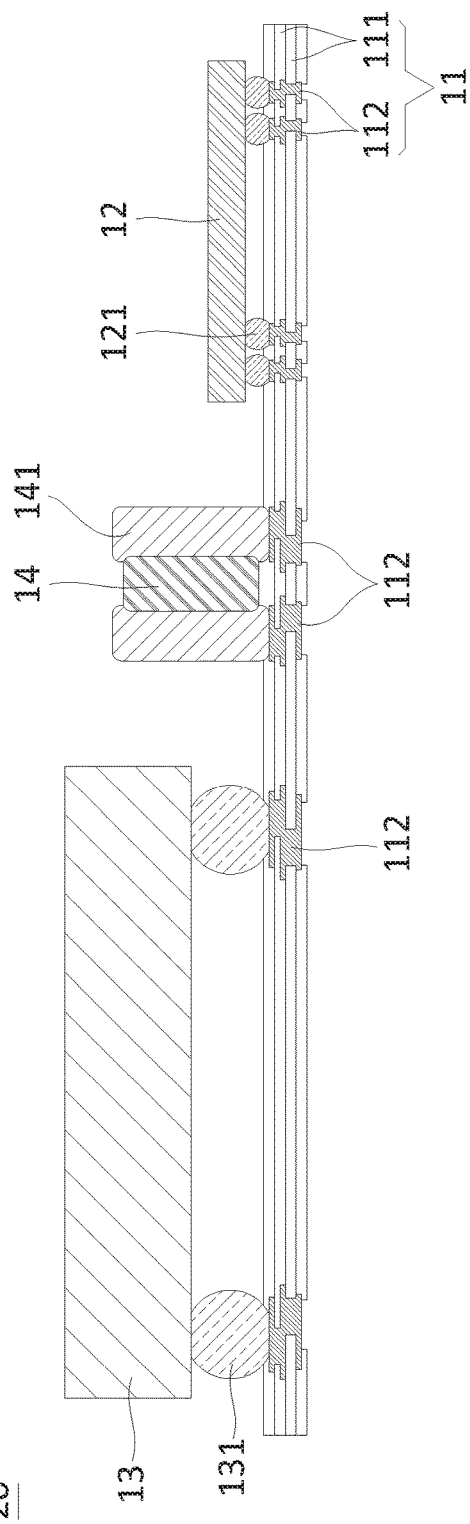

FIG. 1B shows a cross-sectional view of an example semiconductor device 20. In the example shown in FIG. 1B, semiconductor device 20 can comprise substrate 11, electronic components 12, 13, or 14, and interconnects 121 or 131. Substrate 11 and electronic components 12 or 13 can be similar to substrate 11 and electronic components 12 or 13 shown in FIG. 1A. Electronic component 14 can comprise interconnect 141.

Figure 1C:
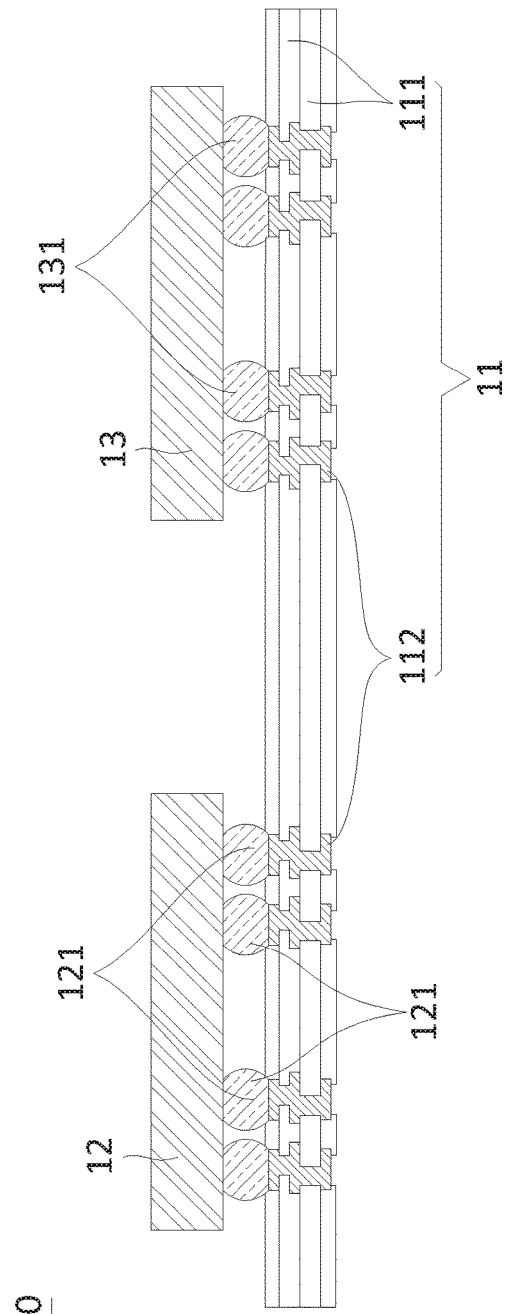

FIG. 1C shows a cross-sectional view of an example semiconductor device 30. In the example shown in FIG. 1C, semiconductor device 30 can comprise substrate 11, electronic component 12, and interconnects 121. Substrate 11 and electronic component 12 can be similar to substrate 11 and electronic components 12 or 13 shown in FIG. 1A. Also, electronic component 12 can be longer or thinner than electronic components 12 or 13 shown in FIG. 1A.

In some examples, substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process.

In some examples, substrate 11 can be a re-distribution layer ("RDL") substrate. In some examples, RDL substrates can comprise one or more conductive redistribution layers and one or more dielectric layers that can be formed layer by layer over an electronic device to which the RDL substrate is to be electrically coupled. In some examples, RDL substrates can comprise one or more conductive re-distribution layers and one or more dielectric layers that can be formed layer by layer over a carrier that can be entirely removed or at least partially removed after the electronic device and the RDL substrate are coupled together. In some examples, window 153 shown in FIG. 2A can comprise or can be a portion of such carrier. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as an electroplating process or an electroless plating process. The conductive patterns can comprise an electrically conductive material such as copper or other plateable metal. The locations of the conductive patterns can be made using a photo-patterning process, for example a photolithography process and a photoresist material to form a photolithographic mask. The dielectric layers of the RDL substrate can be patterned with a photo-patterning process, which can include a photolithographic mask through which light is exposed at photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2), or silicon oxynitride (SiON). The inorganic dielectric layer or layers can be formed by growing the inorganic dielectric layers using an oxidation or nitrodization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

It should be noted that various semiconductor devices 10, 20, or 30 described herein are for the understanding of the present disclosure and that various other semiconductor devices can be used in the present disclosure. The present disclosure can be applied to other semiconductor devices where the electronic component is connected to the substrate via the interconnect.

FIG. 2A shows a cross-sectional view of an example bonder tool for bonding an example semiconductor device. In the example shown in FIG. 2A, laser-assisted-bonding (LAB) tool 15 can comprise laser source 151, stage block (or base chuck) 152, and window 153.

Figure 3A:
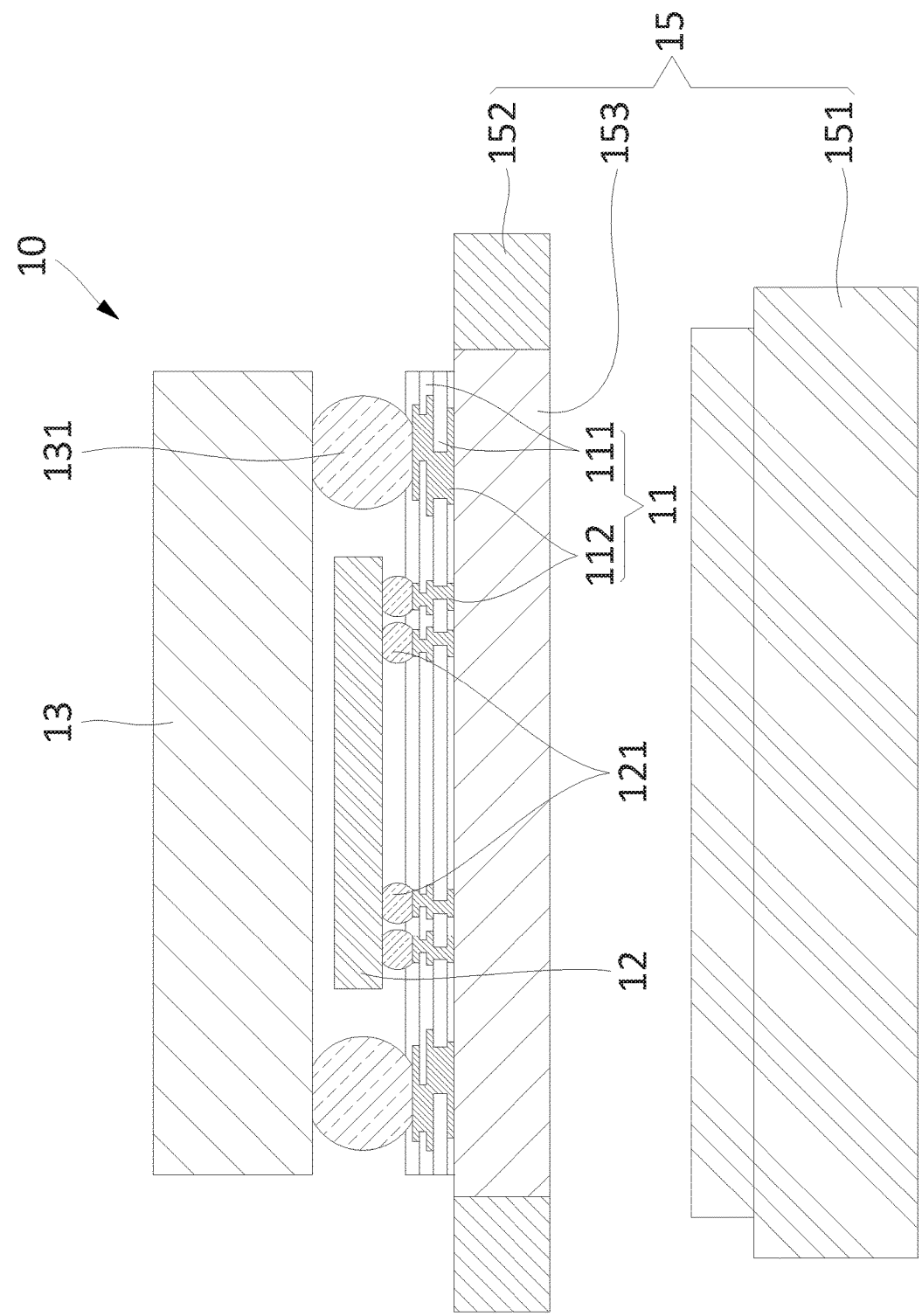
Figure 3B:
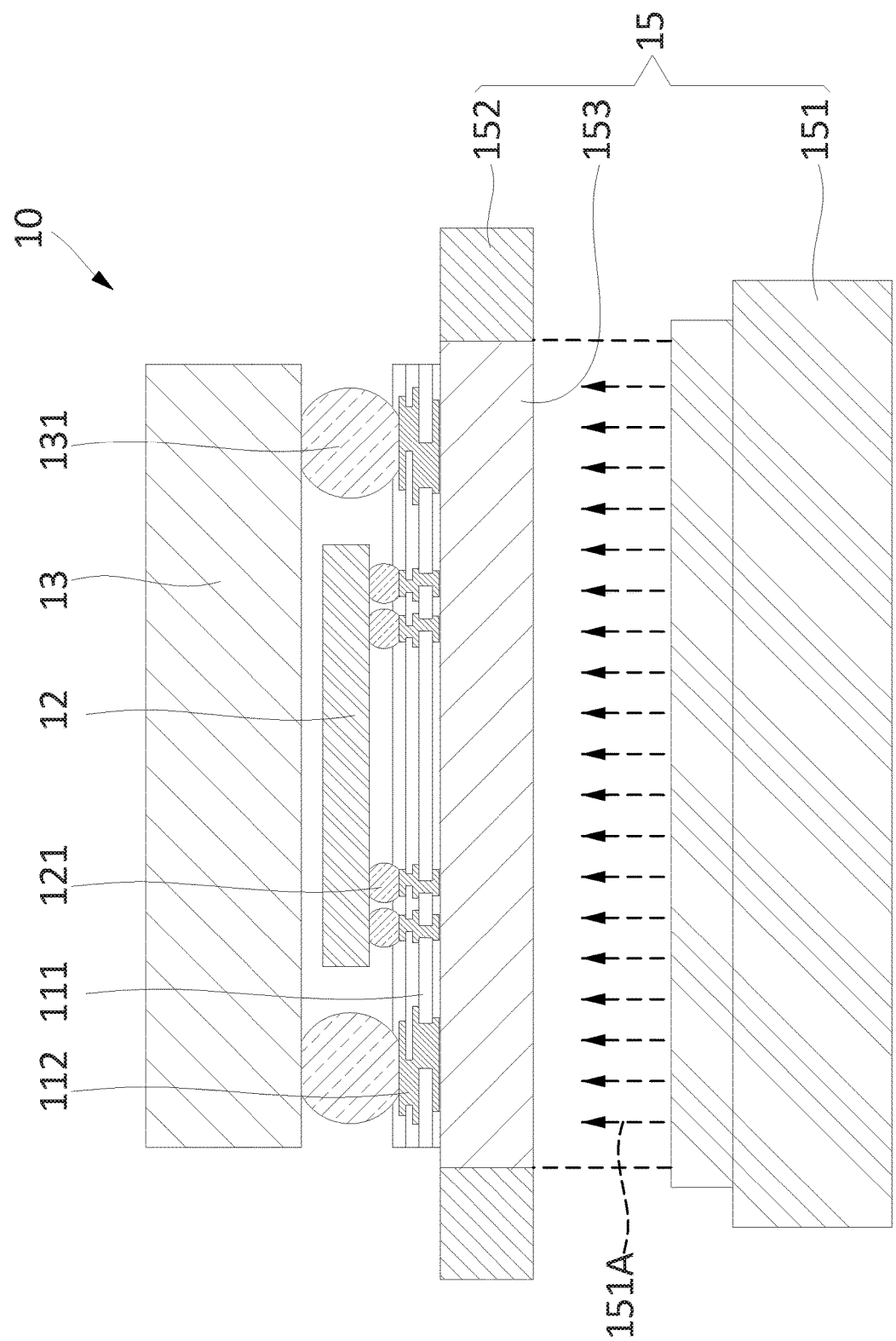

Laser source 151 can irradiate laser beams 151A through window 153 as shown in FIG. 3B. Stage block 152 can comprise or accommodate window 153. In some examples, window 153 can comprise an opening through stage block 152. In some examples, the opening can be filled or covered with a transparent material such as glass or quartz, or a grating or similar structure that lets light through. In some examples, stage block 152 can comprise a ceramic material, or a portion of stage block 152 such as window 153 can comprise a ceramic material. In such examples, a ceramic stage tool can be heated by an external heat source such as laser source 151 using laser beams 151A to accelerate the bonding process through the heating of the ceramic material. In some examples where window 153 comprises a ceramic, the laser beams 151A do not pass through window 153 but operate to heat the ceramic window 153 which in turn heats the semiconductor device 30. In contrast, where the window 152 is transparent, semiconductor device 30 can be heated by passing the laser beams 151A through the window 152 to heat semiconductor device 30 during the bonding process. In some examples the opening through stage block 152 can be optional, where stage block 152 can be itself made of the transparent material, or where window 153 defines the upper surface of stage block 152. Window 153 can be used to support one or more substrates, such as substrates 11 introduced in FIG. 1A to FIG. 1C. Laser beams 151A generated from laser source 151 can be transmitted through window 153 to cause bonding of interconnects 121, 131, or 141 of electronic components 12, 13, or 14 with terminals of conductive structure 112 of substrate 11 as shown in FIG. 1A to FIG. 1C. In some examples, window 153 can comprise a material exhibiting any amount of light transmissivity to allow light at the desired wavelength to pass through, for example at or near the wavelength of laser beams 151A.

Figure 2B:
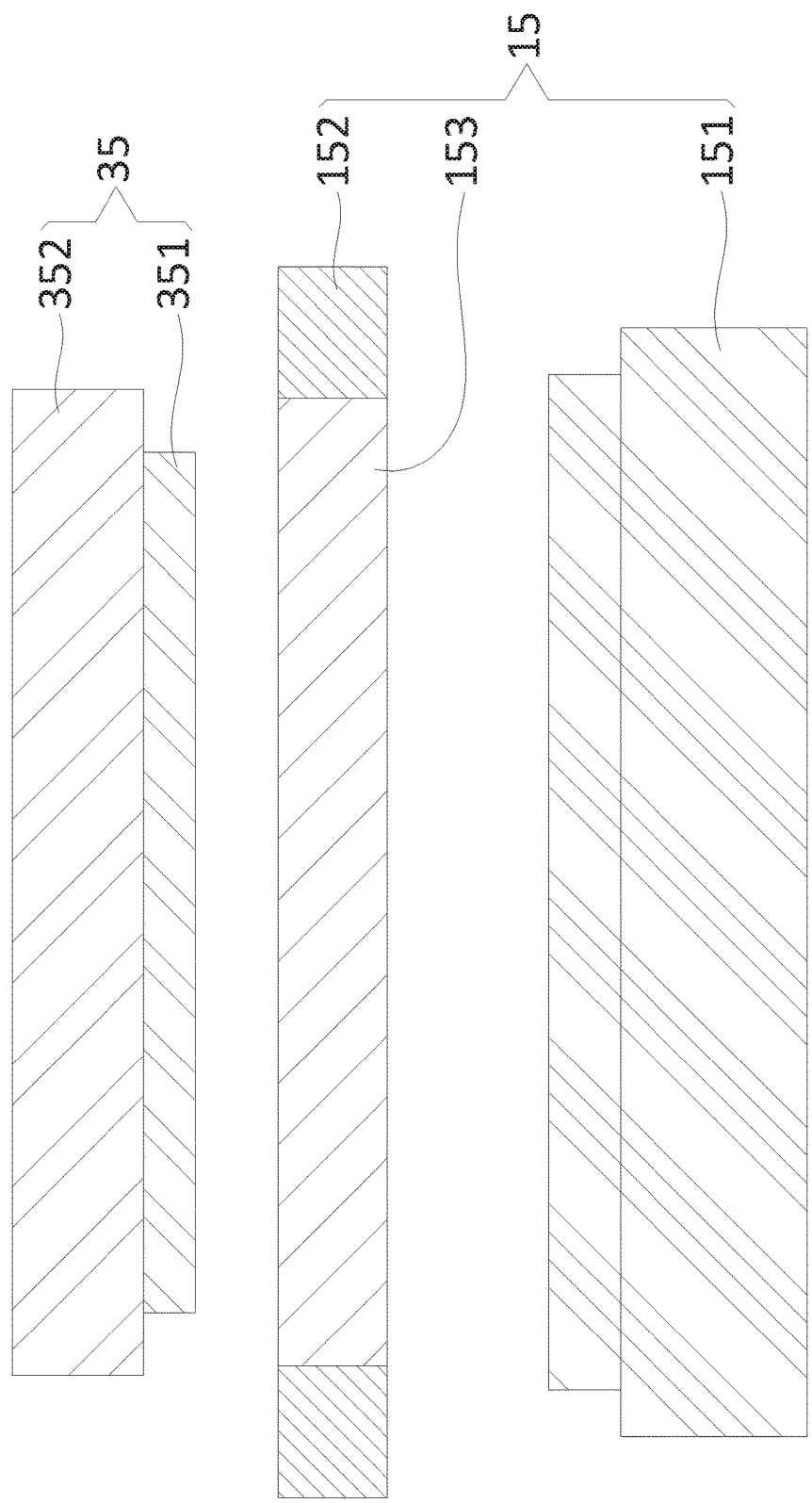

FIG. 2B shows a cross-sectional view of an example hybrid bonder tool for bonding an example semiconductor device. In the example shown in FIG. 2B, hybrid bonder tool 40 can comprise laser-assisted bonder (LAB) tool 15 and thermal/compression bonding (TCB) tool 35.

LAB tool 15 can comprise laser source 151, stage block 152, and window 153. LAB tool 15 can be similar to LAB tool 15 shown in FIG. 2A. Thermal/compression bonder tool 35 can comprise thermal/compression plate 351 and heater source 352.

FIGS. 3A to 3C show cross-sectional views of an example method for bonding an example semiconductor device. In FIGS. 3A to 3C, the example semiconductor device can be semiconductor device 10 shown in FIG. 1A.

FIG. 3A shows semiconductor device 10 and laser-assisted bonder (LAB) tool 15 before laser beam irradiation in a bonding process. Electronic components 12 or 13 are shown placed on substrate 11 but not yet fully bonded to substrate 11 through interconnect 121 or 131, respectively. In some examples, electronic components 12 or 13 can be temporarily bonded or pre-bonded to substrate 11 through interconnect 121 or 131, respectively. In some examples, an electronic component 12 or 13 is provided over substrate 11 such that an interconnect 121 or 131 of the electronic component contacts conductive structure 112 of substrate 11. Substrate 11 can be provided over LAB tool 15 that comprises stage block 152 comprising window 153.

Substrate 11 comprises conductive structure 112 having one or more conductive layers or patterns, and dielectric structure 111 having one or more dielectric layers interlaced with conductive structure 112. In some examples, substrate 11 can have a thickness in the range from about 10 micrometers (μm) to about 2,000 μm. Electronic components 12 or 13 can comprise or be referred to as semiconductor dies, semiconductor chips, or semiconductor packages. In some examples, such semiconductor packages can comprise one or more semiconductor dies or chips coupled to a substrate and encapsulated, with interconnects 121 or 131 exposed. In some examples, interconnect 121 or 131 of electronic components 12 or 13 can be placed in a flip chip type configuration on terminals, such as pads or UBMs (Under-Bump Metallizations), of conductive structure 112 of substrate 11.

In some examples, electronic components 12 or 13 can comprise an application specific integrated circuit, a logic die, a micro control unit, a memory, a digital signal processor, a network processor, a power management unit, an audio processor, a radio-frequency (RF) circuit, or a wireless baseband system on chip processor. In some examples, electronic components 12 or 13 can comprise an active component or a passive component. Electronic components 12 or 13 can have a thickness in the range from about 10 μm to about 1,000 μm.

Interconnects 121 or 131 can electrically connect electronic components 12 or 13 to conductive structure 112 of substrate 11, respectively. Interconnects 121 or 131 can comprise conductive balls or bumps, such as solder balls or bumps, conductive pillars or posts such as copper pillars or posts with solder tips, or metal-core solder balls or bumps having a core comprising, for example, copper or aluminum surrounded by a solder shell. Interconnects 121 or 131 can have diameter in the range from about 10 μm to about 1,000 μm. In some examples, interconnects 121 or 131 can first be formed on or attached to electronic components 12 or 13, and then interconnects 121 or 131 can be placed on substrate 11.

In the example shown in FIG. 3A, LAB tool 15 can be positioned below semiconductor device 10. LAB tool 15 can irradiate laser beams from laser source 151 to melt interconnects 121 or 131 and bond electronic components 12 or 13 to substrate 11. In some examples, electronic components 12 or 13 can be permanently bonded to substrate 11.

In the example shown in FIG. 3A, stage block 152 can be spaced apart from laser source 151 and can be positioned above laser source 151. Stage block 152 can be spaced a working distance apart from laser source 151. In some examples, the working distance can range from about 100 millimeters (mm) to about 1000 mm. The working distance can be preset and can be changed before or during laser irradiation. Stage block 152 can be installed to cover or support peripheries of window 153. Stage block 152 can be provided to cover at least some portions or the whole of the peripheries of window 153. In some examples, a periphery of window 153 or of substrate 11 can rest over stage block 152.

In the example shown in FIG. 3A, window 153 can be coupled to stage block 152. Window 153 can be spaced a working distance apart from laser source 151. The working distance between window 153 and laser source 151 can be similar to the working distance between stage block 152 and laser source 151. Window 153 can support semiconductor device 10.

Window 153 can be made of a material capable of permitting passage of laser beams. In some examples, window 153 can be made of quartz or glass. In some examples, window 153 can be a void or a passageway defined by the inner sidewalls of stage block 152. In some examples, window 153 can comprise a material exhibiting any amount of light transmissivity to allow light at the desired wavelength to pass through, for example at or near the wavelength of laser beams 151A. In some examples, the transmittance of window 153 for laser beams can be about 90% or greater to facilitate the LAB process. In some examples, the transmittance of window 153 can be less than 90%. In some examples, window 153 can comprise a grating or other structure to allow at least some amount of light to pass through. In some examples, window 153 can have a thickness in the range from about 1 mm to about 100 mm. In some examples, stage block 152 can support a workpiece worked on by LAB tool 15. The workpiece an comprise, for example, substrate 11, or electronic component 12 or 13 over substrate 11 including interconnects 121 or 131.

FIG. 3B shows semiconductor device 10 and LAB tool 15 while laser beams are being irradiated during the bonding process. As shown in FIG. 3B, laser beams 151A are irradiated from laser source 151, and heat can be applied or transferred to interconnects 121 or 131 through window 153 and substrate 11. In some examples, when laser beams 151A are irradiated from laser source 151, substrate 11 can be heated and such heat can be transferred to interconnects 121 or 131. In some examples, when laser beams 151A are irradiated from laser source 151, heat can be applied to interconnects 121 or 131. In some examples, such heat can be applied to interconnects 121 or 131 while maintaining the temperature of substrate 11 lower than the temperature of heated interconnects 121 or 131. For instance, interconnects 121 or 131 can be positioned at a focal length or a focal distance, within a depth of field (DOF) range of laser beams 151A. In some examples, such focusing of laser beams 151A on interconnects 121 or 131 can permit greater heating of interconnects 121 or 131 than of substrate 11 or electronic components 12 or 13. With such heating by laser beams 151A, interconnects 121 or 131 can be melted for bonding between substrate 11 and electronic components 12 or 13, which can be permanent bonding in some examples. Laser source 151 can be sized to be larger than the overall size of substrate 11 or can be configured to irradiate with laser beams 151 the entire bottom side of substrate 11 exposed through window 153. Interconnect 121 or 131 of electronic component 12 or 13 can be heated with a laser beam 151A through the window 153 of stage block 152 until the interconnect 121 or 131 is bonded with conductive structure 112 of substrate 11. In some examples, interconnect 121 or 131 can be within the depth of field (DOF) when interconnect 121 or 131 is heated.

In the example shown in FIG. 3B, laser beams 151A are indicated by arrows. Substrate 11 and interconnects 121 or 131 can be positioned within an area where an appropriate temperature for melting interconnects 121 or 131 can be maintained when laser beams 151A are irradiated. The irradiation range of laser beams 151A can vary depending on the thickness and transmittance of window 153 or the working distance. Laser beams 151A can be generated from a pulsed laser or a continuous laser. In some examples, electronic component 12 or 13 can be over a first side of substrate 11, and laser beam 151A can be applied to interconnect 121 or 131 from a second side of substrate 11 opposite to the first side. In some examples, stage block 152 can support window 153 and substrate 11 over laser beam 151A.

In some examples, laser beams 151A can have energy in the range from about 0.1 kilowatts (kW) to about 16 kW to properly heat or melt interconnects 121 or 131 and to avoid undue heating or damage of dielectric structure 111 or conductive structure 112 of substrate 11. In some examples, laser beams 151A can have wavelengths from about 600 μm to about 2,000 μm to properly heat or melt interconnects 121 or 131 and to avoid undue heating or damage of dielectric structure 111 or conductive structure 112 of substrate 11. In some examples, laser beams 151A can be irradiated for a time in the range from about 100 milliseconds (ms) to about 30,000 ms to properly heat or melt interconnects 121 or 131 and to avoid undue heating or damage of dielectric structure 111 or conductive structure 112 of substrate 11. In some examples, the temperature of substrate 11 can be maintained at a temperature lower than a temperature of interconnect 121 or 131 when heat is applied to interconnect 121 of 131 from laser beam 151A. In some examples, the temperature of electronic component 12 or 13 can be maintained lower than a temperature of interconnect 121 or 131 when heat is applied to interconnect 121 or 131 from laser beam 151A. In further examples, a temperature of a mold compound or a molded package adjacent to electronic component 12 or 13 can be maintained lower than a temperature of interconnect 121 or 131 when heat is applied to interconnect 121 or 131 from laser beam 151A.

In some examples, when laser beams 151A are irradiated, substrate 11 can be at a temperature in the range from about 30 degrees Celsius (° C.) to about 300° C. to properly heat or melt interconnects 121 or 131 and to avoid undue heating or damage of dielectric structure 111 or conductive structure 112 of substrate 11. In some examples, when laser beams are irradiated, window 153 can be at a temperature in the range from about 30° C. to about 300° C. In some examples, the temperature of window 153 can be maintained at a range from about 70° C. to about 130° C. lower than a melting temperature of interconnects 121 or 131.

FIG. 3C shows LAB tool 15 after the bonding process is completed. In the example shown in FIG. 3C, when bonding between substrate 11 and electronic components 12 or 13 is completed, irradiation of laser beams 151A can be stopped, and semiconductor device 10 can be transferred to a next stage. When irradiation of laser beams 151A is stopped, supply of the heat from laser beams can be immediately interrupted. As such, since the supply of heat by the laser beams is stopped, interconnects 121 or 131 can be solidified again. Solidified interconnects 121 or 131 can allow an electrical or mechanical interconnection between electronic components 12 or 13 and the substrate 11. Bonding of a next semiconductor device can be performed immediately using laser beams 151A, without a separate cooling process.

Figure 4A:
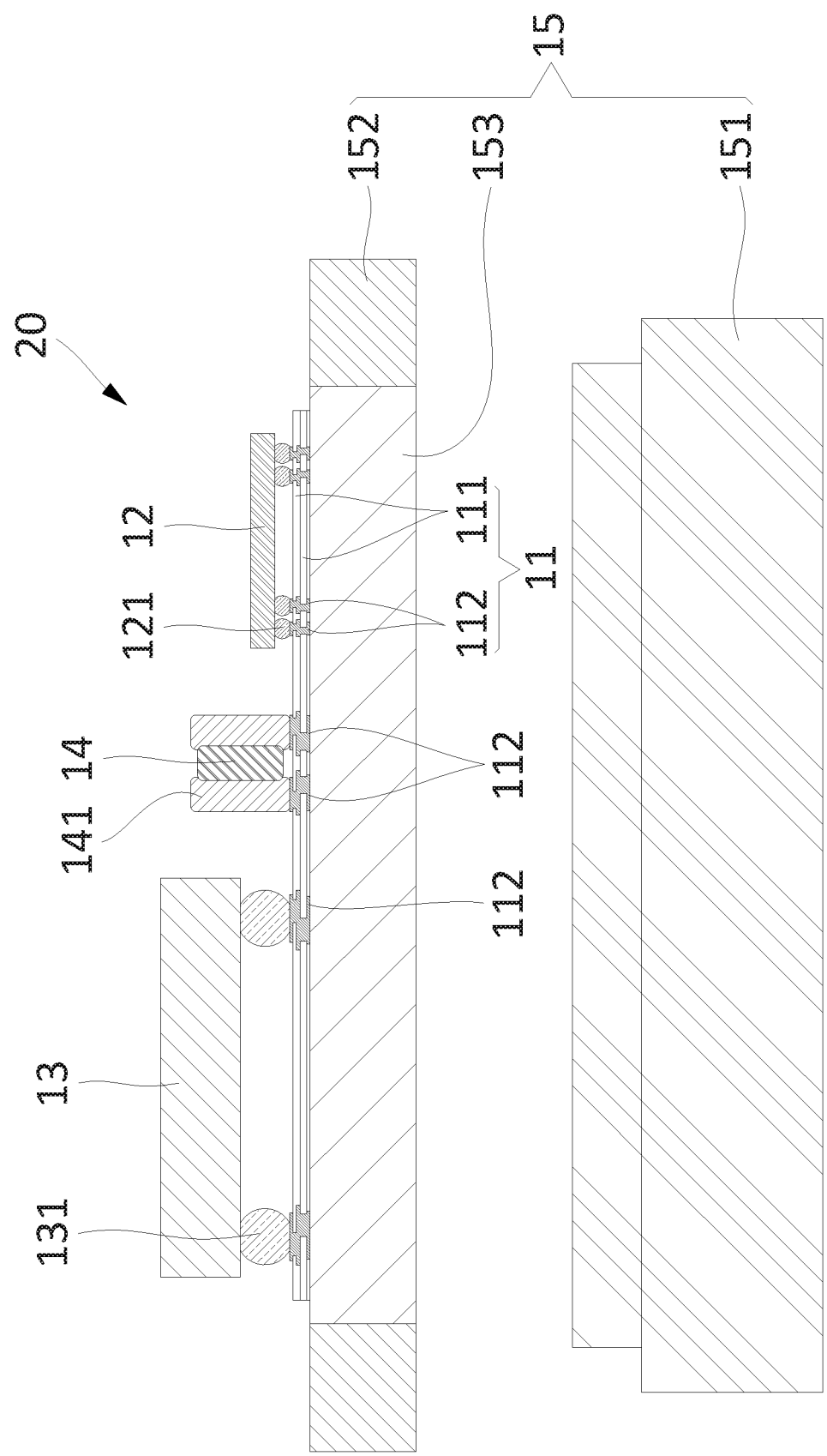
FIGS. 4A to 4C show cross-sectional views of an example method for bonding an example semiconductor device.
Figure 4B:
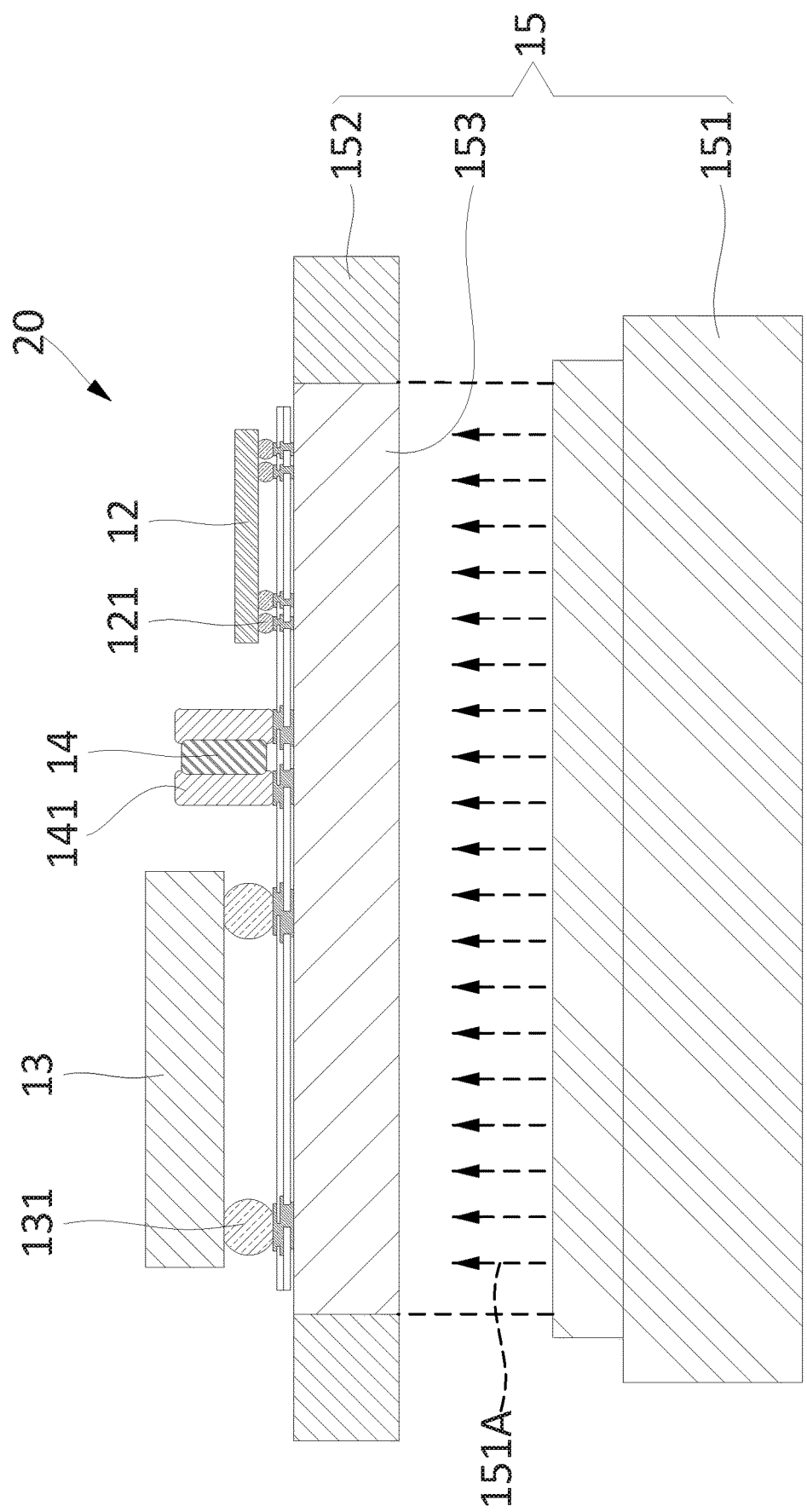
Figure 4C:
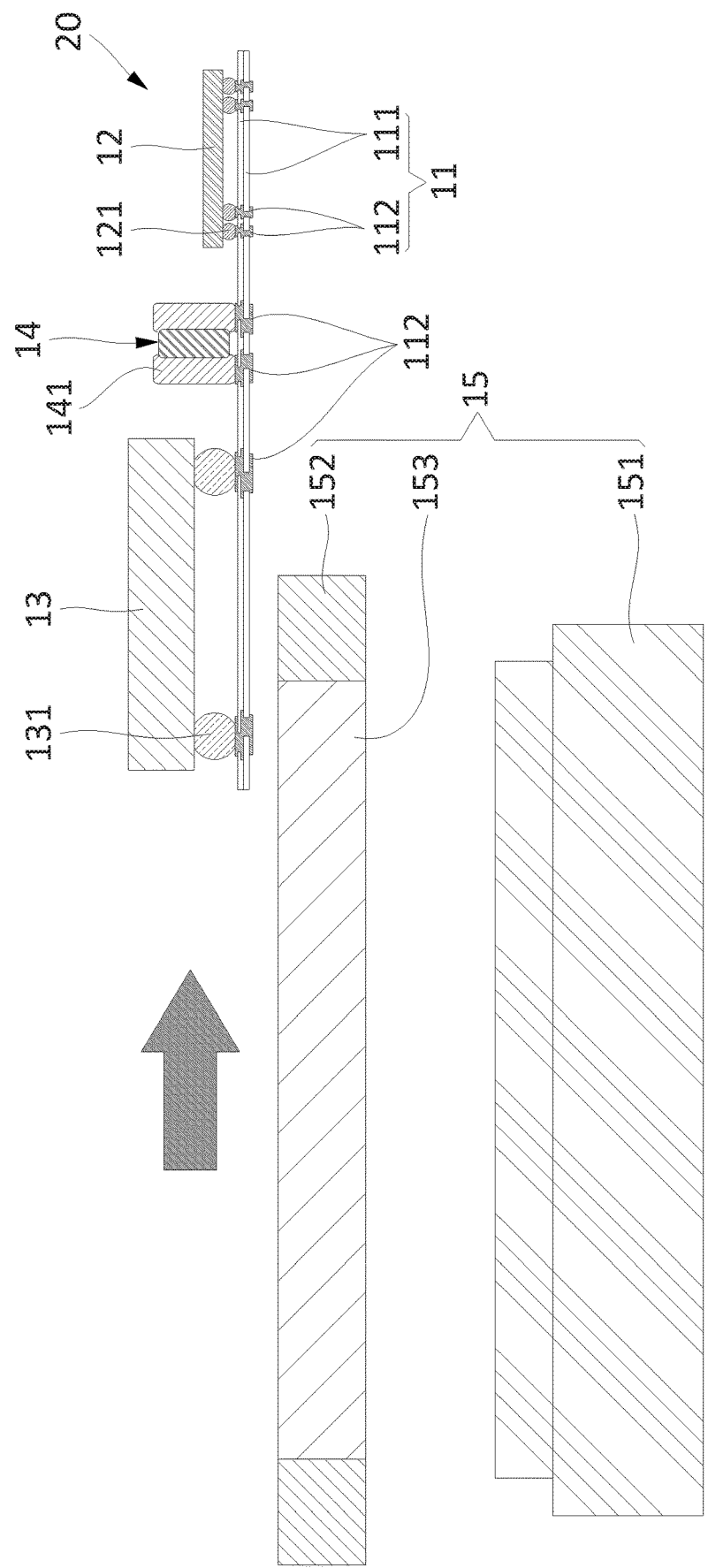

FIGS. 4A to 4C show cross-sectional views of an example method for bonding an example semiconductor device. The example semiconductor device 20 shown in FIGS. 4A to 4C can be similar to semiconductor device 20 shown in FIG. 1B.

FIG. 4A shows semiconductor device 20 and laser-assisted bonder (LAB) tool 15 before laser beams 151A are being irradiated during a bonding process. FIG. 4B shows semiconductor device 20 and LAB tool 15 while laser beams 151A are irradiated during the bonding process. FIG. 4C shows LAB tool 15 after the bonding process is completed. In the examples shown in FIGS. 4A to 4C, substrate 11, electronic components 12 or 13 and interconnects 121 or 131 of semiconductor device 20 can be similar to those of semiconductor device 10 shown in FIGS. 3A to 3C.

Electronic component 14 can comprise a passive component or passive devices. Electronic component 14 can be temporarily connected to conductive structures 112 of substrate 11 through interconnects 141. In some examples, electronic component 14 can comprise at least one of a resistor, a capacitor, an inductor, or a connector. Electronic component 14 can have a thickness in the range from about 0.1 mm to about 3 mm.

In the example shown in FIG. 4A, LAB tool 15 can be positioned below semiconductor device 20. LAB tool 15 can irradiate laser beams 151A from laser source 151 to melt interconnects 121 or 131, 141 and to bond electronic components 12 or 13, 14 to substrate 11.

In the example shown in FIG. 4A-4C, laser source 151, stage block 152 and window 153 of LAB tool 15 can be similar to those of LAB tool 15 describe with respect to FIGS. 3A-3C. The example method shown in FIGS. 4A-4C can be similar to that described with respect to FIGS. 3A-3C.

Figure 5A:
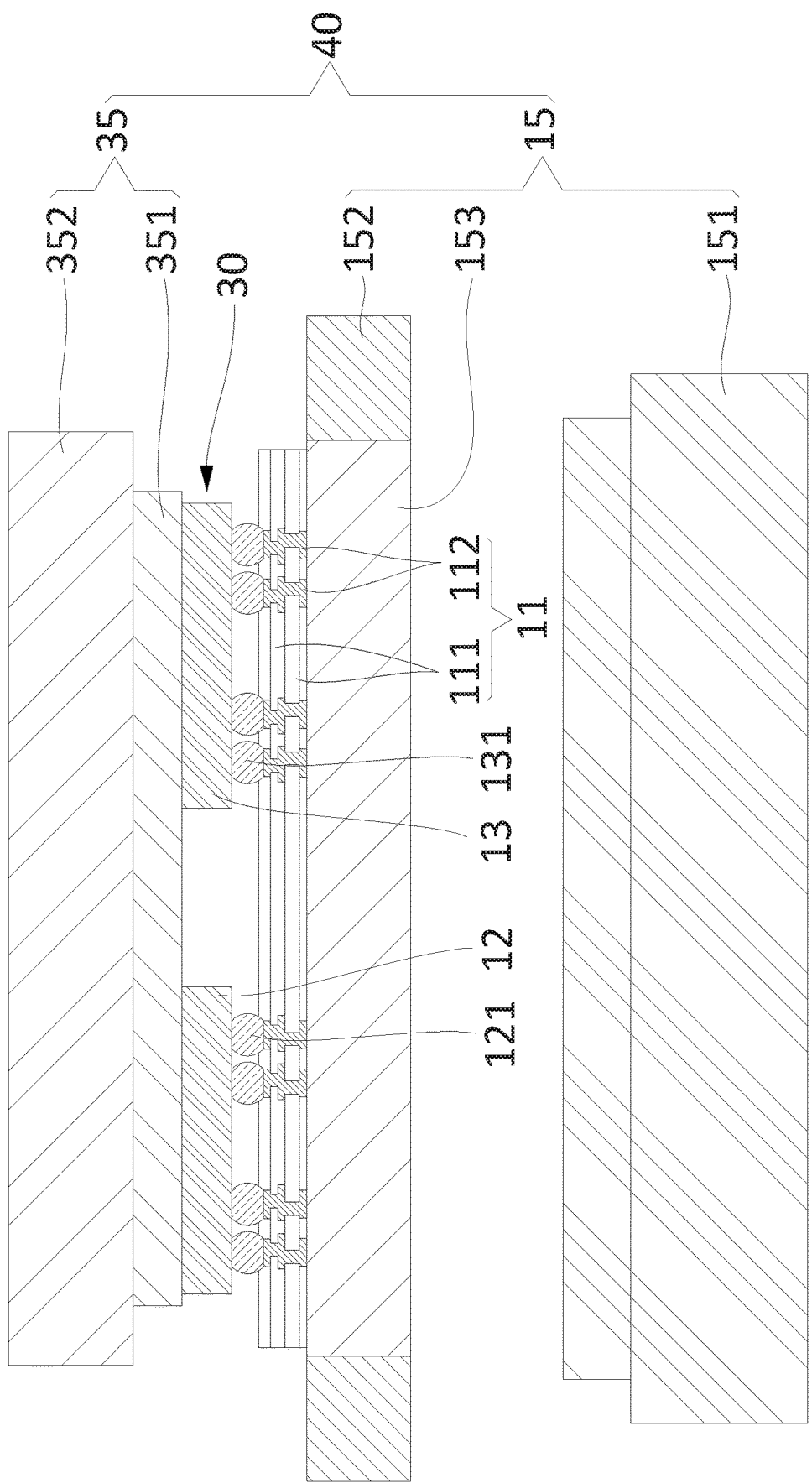
FIGS. 5A to 5C show cross-sectional views of an example method for bonding an example semiconductor device.
Figure 5B:
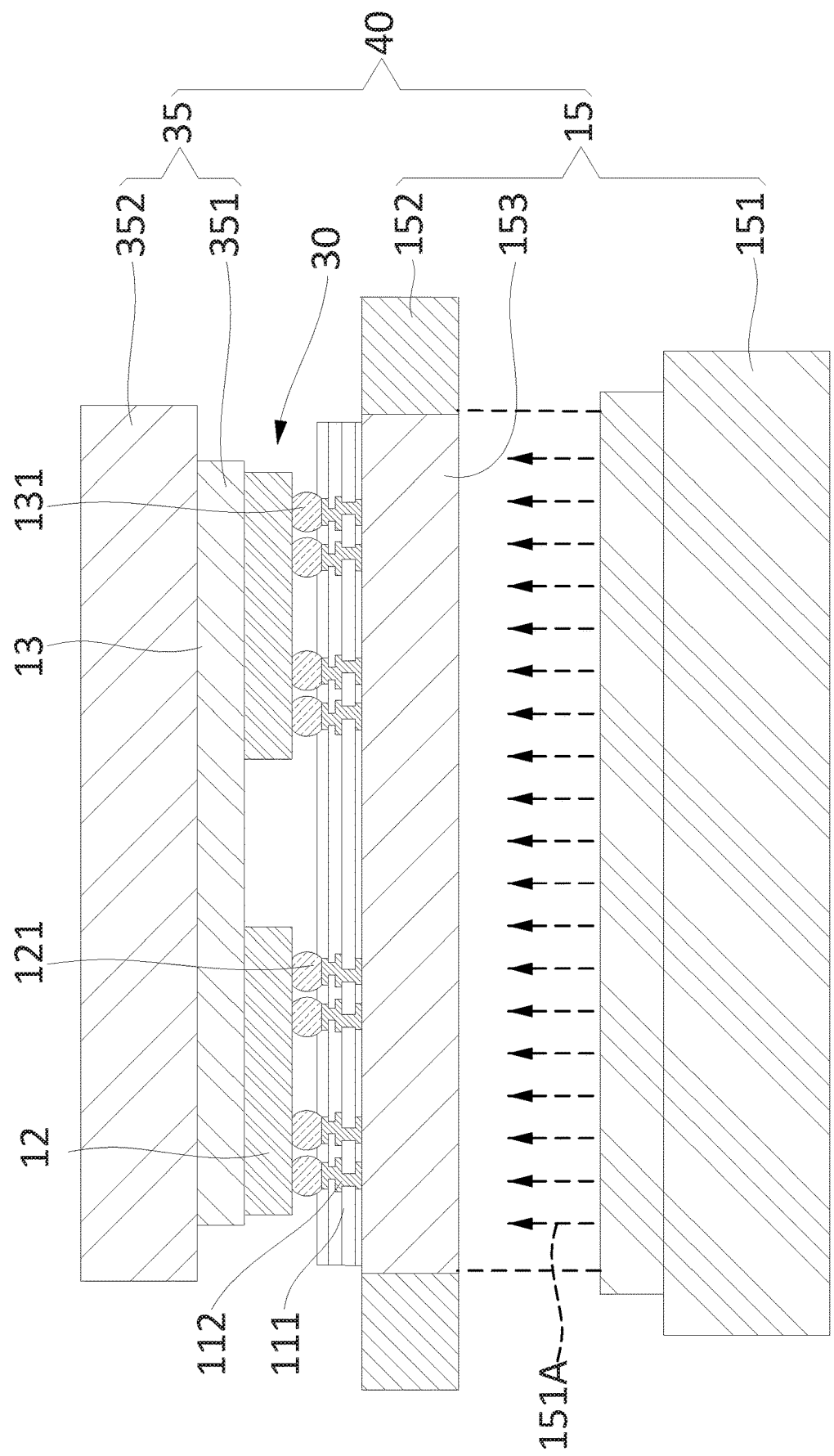
Figure 5C:
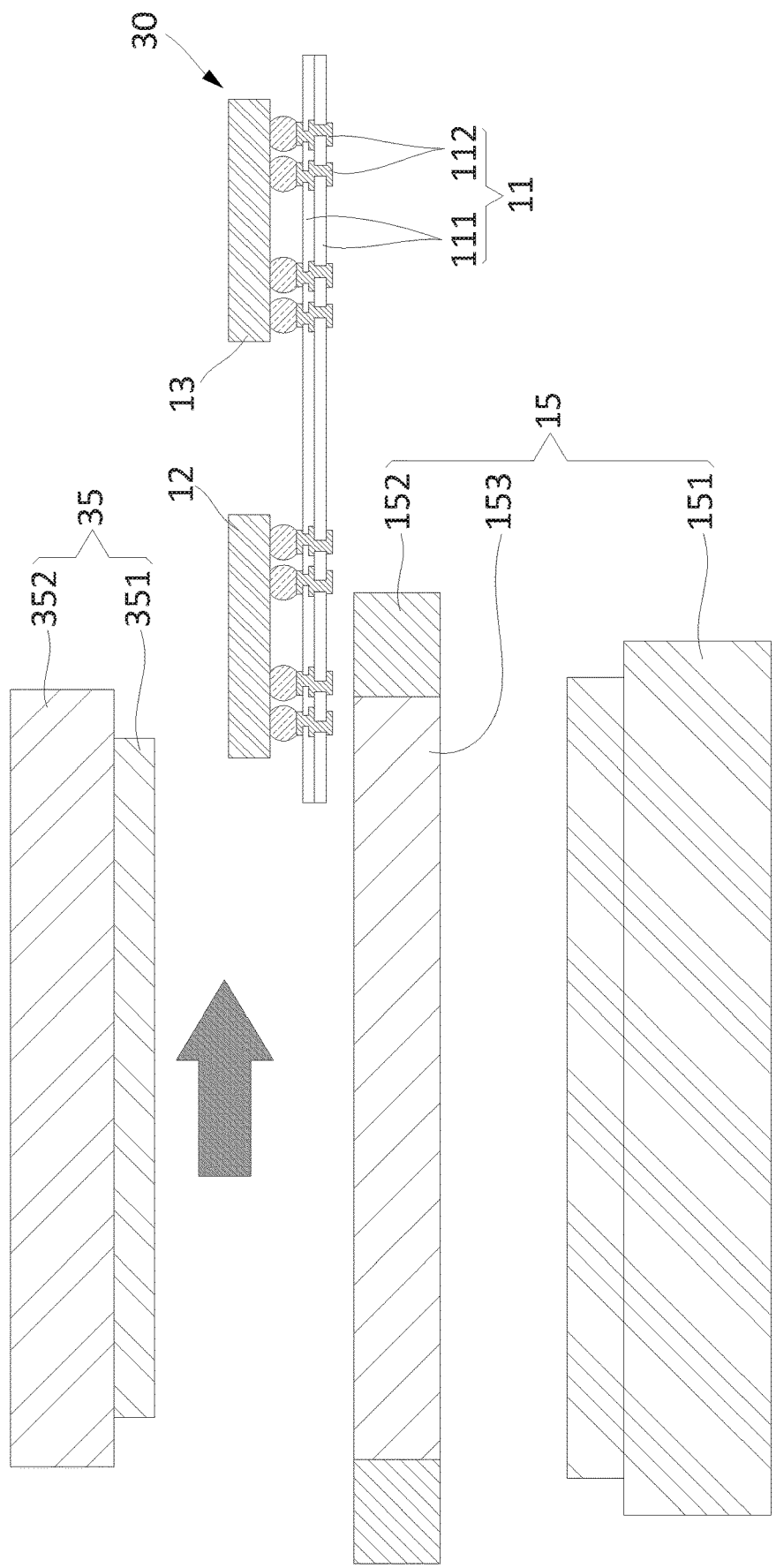

FIGS. 5A to 5C show cross-sectional views of an example method for bonding an example semiconductor device. The example semiconductor device shown in FIGS. 5A to 5C can be similar with the semiconductor device 30 shown in FIG. 1C.

FIG. 5A shows semiconductor device 30 and hybrid bonder tool 40 before laser beam irradiation in a bonding process. In the examples shown in FIGS. 5A to 5C, substrate 11, electronic component 12 and interconnects 121 of semiconductor device 30 can be similar to substrate 11, electronic components 12 or 13 and interconnects 121 or 131 of semiconductor device 10 shown in FIGS. 3A to 3C. In some examples, electronic component 12 or 13 can be provided over one side of substrate 11 such that an interconnect 121 or 131 of electronic component 12 or 13 contacts conductive structure 112 of substrate 11.

In some examples, electronic component 12 or 13 could be prone to warpage during laser bonding using LAB tool 15 and the process of FIGS. 3A-3C. For instance, heat from laser beams 151A in FIG. 3B can be transferred to electronic component 12 or 13 during the bonding process thereby resulting in warpage occurring to electronic component 12. Such warpage can happen, for example, if the area of electronic component 12 or 13 is sufficiently large, or the thickness or electronic component 12 or 13 is sufficiently thin, relative to the amount of heat transferred during LAB bonding. To avoid or prevent warpage, the bonding process of semiconductor device 30 can be performed by hybrid bonder tool 40. Furthermore, although FIGS. 5A-5C show a semiconductor device 30 comprising two separate and smaller electronic components 12 and 13, in some examples semiconductor device 30 can comprise a single electronic component 12 that can be longer or larger and thinner than electronic components 12 or 13 as shown in FIGS. 5A-5C. In such examples, a longer, larger, or thinner die such as electronic component 12 may be susceptible to warpage and non-wet interconnects 121, for example near the edges of electronic component 12. In some examples, semiconductor device 30 can comprise a single electronic component 12, or semiconductor device 30 can comprise multiple electronic components 12 and 13 as shown in FIG. 5A. In some examples where semiconductor device 30 comprises a single electronic component, electronic component 12 can comprise a larger area or thinner die having an area from about 10 mm by 10 mm up to about 300 mm by 300 mm with a thickness of about 30 μm to about 10 mm. In some examples, semiconductor device 30 can comprise a package in addition to a die, for example an electronic component comprising a die or electronic component 12, interposer, substrate, or interconnects in a package structure. The susceptibility to warpage and non-wet interconnects 121 by such larger area semiconductor devices 30 can be avoided or mitigated by using vacuum. For example, window 153 can comprise one or more vacuum holes therethrough to allow the application of vacuum to semiconductor device 30. Lab tool 15 can include a vacuum mechanism to apply vacuum through the vacuum holes of window 153 to force semiconductor device 30 including substrate 11 against window 153 during heating to prevent warpage of substrate 11. In some examples, TCB tool 35 can also include a vacuum mechanism, or can employ the same vacuum mechanism as LAB tool 15, to apply a vacuum to semiconductor device 30 from the opposite side as LAB tool 15. In such examples, thermal/compression plate 351 can comprise one or more vacuum holes for the application of a vacuum to maintain or force electronic component 12 against thermal/compression plate 351 to prevent warpage of electronic component 12 and to prevent non-wetting of interconnects 121 during heating.

In the example shown in FIG. 5A, hybrid bonder tool 40 can comprise LAB tool 15 to irradiate laser beams 151A from laser source 151 positioned below semiconductor device 30 for bonding electronic components 12 or 13 to substrate 11. Hybrid bonder tool 40 can also comprise TCB tool 35 to also bond electronic components 12 or 13 to substrate 11 while preventing warpage of electronic components 12 or 13. TCB tool 35 comprises thermal/compression plate 351 and heater source 352, and can compresses or provide backing for electronic component 12 from above while heat is applied to limit warpage of electronic component 12 or 13 during the bonding process. Thermal/compression plate 351 can be configured to press a top side of electronic component 12 or 13 opposite interconnect 121 or 131 when laser 151A of LAB tool 15 applies heat to interconnect 121 or 131. Thermal/compression plate 351 can be configured to transfer additional heat or compression to interconnect 121 or 131 when thermal/compression plate 315 presses top side of electronic component 12 or 13.

TCB tool 35 can be positioned above LAB tool 15. Thermal/compression plate 351 can be initially positioned spaced apart from electronic component 12 and can then be lowered after semiconductor device 30 is placed on window 153. Thermal/compression plate 351 can be brought into contact with a top surface of electronic component 12 to maintain pressure on electronic component 12 against substrate 11. Thermal/compression plate 351 can apply pressure on electronic component 12 with a pressure in the range from about 1 Newton (N) to about 500 N. In some examples, thermal/compression plate 351 can have a thickness in the range from about 1 mm to about 5 mm.

In some examples, thermal/compression plate 351 can vacuum-latch electronic component 12 while simultaneously compressing electronic component 12. In some examples, vacuum latching can be achieved by coupling thermal/compression plate 351 to a vacuum generator that creates vacuum suction through openings at the bottom side of plate 351 and exposing the top side of electronic component 12 or 13 to such vacuum openings of plate 351. When the heat is transferred to electronic component 12 or 13, thermal/compression plate 351 can remain latched to electronic component 12 or 13 while compressing electronic component 12 or 13 from above to prevent electronic component 12 or 13 from being warped.

Thermal/compression plate 351 can be coupled with heater source 352 for heating thermal/compression plate 351, and such heat can be transferred to electronic component 12 or 13 when the bottom surface of thermal/compression plate 351 is brought into contact with the top surface of electronic component 12 or 13. In some examples, heater source 352 can be maintained at a preset temperature in the range from about 10° C. to about 450° C.

The heat transferred from thermal/compression plate 351 to the top surface of electronic component 12 or 13 can prevent warpage that could otherwise occur due to a mismatch between the temperature of the top and bottom sides of electronic component 12 or 13. For instance, when only LAB tool 15 is used, laser beams 151A can cause the bottom side of electronic component 12 or 13 to be heated more, and to thus expand more, than the top side of electronic component 12 or 13 wherein such difference can induce warpage. By applying compensatory heat with thermal/compression plate 351 to the top side of electronic component 12 or 13, such warpage tendency can be controlled. In some examples, a temperature of substrate 11 can be maintained lower than a temperature of interconnect 121 or 131 when heat is applied to interconnect 121 or 131 from LAB tool 15. In some examples, a temperature of electronic component 12 or 13 with TCB tool 35 can be maintained lower than a temperature of interconnect 121 or 131 when heat is applied to interconnect 121 or 131 from LAB tool 15.

FIG. 5B shows semiconductor device 30 and LAB tool 15 while laser beams 151A are being irradiated during the bonding process. In the example shown in FIG. 5B, an example method for bonding semiconductor device 30 to substrate 11 by irradiating laser beams 151A from laser source 151 to melt interconnects 121 of semiconductor device 30 can be similar to the example method shown in FIGS. 3B and 4B. In the example shown in FIG. 5B, during the bonding process, thermal/compression bonder tool 35 can compress or heat electronic devices 12 or 13 from above. In some examples, heat can be applied to interconnect 121 or 131 with laser beam 151A from LAB tool 15 through a substrate side opposite to the side on which electronic component 12 or 13 is positioned. Heat or compression can be applied to interconnect 121 or 131 with TCB tool 35 through electronic component 12 or 13. In some examples, laser beam 151A can have a depth of field (DOF), and interconnect 121 or 131 can be in the DOF when heated. In some examples, LAB tool 15 and TCB tool 35 can be applied concurrently. In some examples, window 153 can face or contact a side of substrate 11 opposite to the side of substrate 11 on which electronic component 12 or 13 is located when heat is applied by LAB tool 15.

FIG. 5C shows LAB tool 15 after the bonding process is completed. In the example shown in FIG. 5C, once bonding of substrate 11 and electronic component 12 or 13 is completed, irradiation of laser beams 151A can be interrupted, and thermal/compression bonder tool 35 can be separated from semiconductor device 30 and then elevated. After thermal/compression bonder tool 35 is separated from semiconductor device 30, semiconductor device 30 can be transferred to a next stage.

The present disclosure includes reference to certain examples. It will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A method to manufacture a semiconductor device, comprising:
providing an electronic component over a substrate, the electronic component comprising a body comprising silicon and an interconnect comprising a metal, wherein the interconnect of the electronic component contacts a conductive structure of the substrate;
providing the substrate over a laser assisted bonding (LAB) tool, wherein the LAB tool comprises a stage block comprising a window, wherein the window of the stage block comprises a solid translucent material; and
heating the interconnect with a laser beam through the window until the interconnect is bonded with the conductive structure;
wherein more heat is applied to the interconnect than to the body of the electronic component;
wherein the stage block supports the window and the substrate over the laser beam, and wherein the laser beam is directed at the interconnect through a bottom side of the window and through the substrate without passing through the electronic component;
wherein the substrate is on the window, and the window is configured to support the substrate; and
wherein a footprint of the window is as large or larger than a footprint of the substrate.

2. The method of claim 1, wherein the laser beam has a depth of field (DOF) and the interconnect is in the DOF when heated.

3. The method of claim 1, wherein the window comprises quartz.

4. The method of claim 1, wherein the electronic component is over a first side of the substrate, and the laser beam is applied to the interconnect from a second side of the substrate opposite to the first side.

5. The method of claim 1, further comprising maintaining a temperature of the substrate directly adjacent to the interconnect lower than a temperature of the interconnect when heat is applied to the interconnect from the laser beam.

6. The method of claim 1, further comprising maintaining a temperature of the electronic component directly adjacent to the interconnect lower than a temperature of the interconnect when heat is applied to the interconnect from the laser beam.

7. The method of claim 1, further comprising maintaining a temperature of a mold compound adjacent to the electronic component and directly adjacent to the interconnect at a lower temperature than a temperature of the interconnect when heat is applied to the interconnect from the laser beam.

8. A method to manufacture a semiconductor device, comprising:
providing an electronic component over a first substrate side of a substrate, wherein the electronic component comprises semiconductor material, and wherein an interconnect of the electronic component contacts a conductive structure of the substrate;
providing the substrate in a hybrid bonder tool comprising a laser assisted bonding (LAB) tool and a thermal/compression boding (TCB) tool;
applying a first heat to the interconnect with a laser beam from the LAB tool through a second substrate side opposite the first substrate side; and
applying a second heat and compression to the interconnect with the TCB tool through the electronic component;
wherein the LAB tool comprises a window, wherein the window comprises a solid translucent material, wherein the substrate is on the window, and wherein the laser beam is applied to the interconnect through the window; and
wherein the laser beam is directed at the interconnect through a bottom side of the window and through the substrate without passing through the electronic component.

9. The method of claim 8, wherein the laser beam has a depth of field (DOF) and the interconnect is in the DOF when heated.

10. The method of claim 8, wherein the TCB tool comprises a heater source and a thermal/compression plate, wherein the second heat is applied with the heater source through the thermal/compression plate, and the compression is applied with the thermal/compression plate pressing onto the electronic component.

11. The method of claim 8, wherein the LAB tool and the TCB tool are applied concurrently.

12. The method of claim 8, further comprising maintaining a temperature of the substrate directly adjacent to the interconnect lower than a temperature of the interconnect when the first heat is applied to the interconnect from the LAB tool.

13. The method of claim 8, further comprising maintaining a temperature of the electronic component directly adjacent to the interconnect with the TCB tool lower than a temperature of the interconnect when the first heat is applied to the interconnect from the LAB tool.

14. The method of claim 8, wherein the window contacts a second side of the substrate when the first heat is applied.

15. A method of manufacturing a semiconductor device using a laser assisted bonding (LAB) tool, the method comprising:
providing a laser source; and
providing a stage block comprising a physical window over the laser source;

wherein the laser source is configured to direct a laser beam to the physical window to apply a first heat on an interconnect of a workpiece supported by the stage block;

wherein the workpiece comprises an electronic component comprising the interconnect, and a substrate comprising a conductive structure contacting the interconnect;

wherein the laser beam is directed at the interconnect and through the physical window from a direction below the workpiece;

wherein a portion of the workpiece directly adjacent to the interconnect is maintained at lower temperature than a temperature of the interconnect when the first heat is applied to the interconnect from the laser beam;

wherein the laser beam is directed at the interconnect through a bottom side of the physical window and through the substrate without passing through the electronic component;

wherein the workpiece is on the physical window, and the physical window is configured to support the workpiece; and wherein a footprint of the physical window is as large or larger than a footprint of the workpiece.

16. The method of claim 15, wherein:

the substrate comprises a first side and a second side opposite the first side;

wherein the electronic component is over the first side of the substrate and contacting the conductive structure via the interconnect; and wherein the laser source is configured to emit the laser beam to apply the first heat on the interconnect through the second side of the substrate.

17. The method of claim 15, further comprising:

providing a thermal/compression bonding (TCB) tool, comprising a thermal/compression plate;

wherein:

the thermal/compression plate is configured to press a top side of the electronic component opposite the interconnect when the laser source applies the first heat on the interconnect, and the thermal/compression plate is configured to transfer a second heat and compression to the interconnect when the thermal/compression plate presses the top side of the electronic component.

18. The method of claim 15, wherein the physical window comprises a ceramic.

19. The method of claim 8, wherein the window is configured to support the substrate.

20. The method of claim 8, wherein a footprint of the window is as large or larger than a footprint of the substrate.

21. The method of claim 15, wherein the electronic component comprises silicon and the substrate comprises a non-silicon material.

* * * * *